(12) United States Patent
Patterson

(10) Patent No.: US 7,768,338 B2
(45) Date of Patent: Aug. 3, 2010

(54) THERMALTRONIC ANALOG DEVICE

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 9 days.

(21) Appl. No.: 12/237,027

(22) Filed: Sep. 24, 2008

(65) Prior Publication Data

US 2009/0206907 A1    Aug. 20, 2009

Related U.S. Application Data

(63) Continuation-in-part of application No. 12/120,109, filed on May 13, 2008, now Pat. No. 7,659,750, which is a continuation-in-part of application No. 12/040,765, filed on Feb. 29, 2008, now Pat. No. 7,564,267, which is a continuation-in-part of application No. 12/032,549, filed on Feb. 15, 2008.

(51) Int. Cl.
*H01L 35/00* (2006.01)

(52) U.S. Cl. .................................................. 327/512
(58) Field of Classification Search ................ 327/513; 136/236; 374/163
See application file for complete search history.

(56) References Cited

U.S. PATENT DOCUMENTS 6,639,395 B2 * 10/2003 Male .......................... 324/106
7,042,690 B2 *  5/2006 Male ............................ 361/62

* cited by examiner

*Primary Examiner*—Kenneth B. Wells
(74) *Attorney, Agent, or Firm*—Law Office of Gerald Maliszewski; Gerald Maliszewski

(57) ABSTRACT

A method is provided for the electronic processing of analog signals in thermaltronic device. The method accepts an analog input signal, e.g., an AC signal, at a thermaltronic device input and generates a thermal electric (TE) temperature having a first transfer function responsive to the input signal. As opposed to having a digital response, the transfer function is either linear or logarithmic. An analog output signal, e.g., an AC signal, is generated having a second transfer function responsive to the TE, which is likewise either linear or logarithmic.

16 Claims, 12 Drawing Sheets

Nickel and Bismuth

| a1 | b1 | a2 | b2 | temperature C | | emf in millivolts one layer | emf in millivolts ten layers | emf in millivolts 25 layers |
|---|---|---|---|---|---|---|---|---|
| 19.1 | -43.7 | -0.03 | -0.47 | 25 | | 0.9225 | 9.225 | 23.0625 |
| 19.1 | -43.7 | -0.03 | -0.47 | 100 | | 5.34 | 53.4 | 133.5 |
| 19.1 | -43.7 | -0.03 | -0.47 | 125 | | 7.3625 | 73.625 | 184.0625 |
| 19.1 | -43.7 | -0.03 | -0.47 | 0 | | 0 | 0 | 0 |
| 19.1 | -43.7 | -0.03 | -0.47 | 5 | | 0.1625 | 1.625 | 4.0625 |
| 19.1 | -43.7 | -0.03 | -0.47 | 10 | | 0.336 | 3.36 | 8.4 |
| 19.1 | -43.7 | -0.03 | -0.47 | 15 | | 0.5205 | 5.205 | 13.0125 |
| 19.1 | -43.7 | -0.03 | -0.47 | 20 | | 0.716 | 7.16 | 17.9 |
| 19.1 | -43.7 | -0.03 | -0.47 | 25 | | 0.9225 | 9.225 | 23.0625 |
| 19.1 | -43.7 | -0.03 | -0.47 | 30 | | 1.14 | 11.4 | 28.5 |
| 19.1 | -43.7 | -0.03 | -0.47 | 35 | | 1.3685 | 13.685 | 34.2125 |
| 19.1 | -43.7 | -0.03 | -0.47 | 40 | | 1.608 | 16.08 | 40.2 |
| 19.1 | -43.7 | -0.03 | -0.47 | 45 | | 1.8585 | 18.585 | 46.4625 |
| 19.1 | -43.7 | -0.03 | -0.47 | 50 | | 2.12 | 21.2 | 53 |
| 19.1 | -43.7 | -0.03 | -0.47 | 55 | | 2.3925 | 23.925 | 59.8125 |
| 19.1 | -43.7 | -0.03 | -0.47 | 60 | | 2.676 | 26.76 | 66.9 |
| 19.1 | -43.7 | -0.03 | -0.47 | 65 | | 2.9705 | 29.705 | 74.2625 |
| 19.1 | -43.7 | -0.03 | -0.47 | 70 | | 3.276 | 32.76 | 81.9 |
| 19.1 | -43.7 | -0.03 | -0.47 | 75 | | 3.5925 | 35.925 | 89.8125 |
| 19.1 | -43.7 | -0.03 | -0.47 | 80 | | 3.92 | 39.2 | 98 |
| 19.1 | -43.7 | -0.03 | -0.47 | 85 | | 4.2585 | 42.585 | 106.4625 |
| 19.1 | -43.7 | -0.03 | -0.47 | 90 | | 4.608 | 46.08 | 115.2 |
| 19.1 | -43.7 | -0.03 | -0.47 | 95 | | 4.9685 | 49.685 | 124.2125 |
| 19.1 | -43.7 | -0.03 | -0.47 | 100 | | 5.34 | 53.4 | 133.5 |
| 19.1 | -43.7 | -0.03 | -0.47 | 105 | | 5.7225 | 57.225 | 143.0625 |
| 19.1 | -43.7 | -0.03 | -0.47 | 110 | | 6.116 | 61.16 | 152.9 |
| 19.1 | -43.7 | -0.03 | -0.47 | 115 | | 6.5205 | 65.205 | 163.0125 |
| 19.1 | -43.7 | -0.03 | -0.47 | 120 | | 6.936 | 69.36 | 173.4 |
| 19.1 | -43.7 | -0.03 | -0.47 | 125 | | 7.3625 | 73.625 | 184.0625 |
| 19.1 | -43.7 | -0.03 | -0.47 | 130 | | 7.8 | 78 | 195 |
| 19.1 | -43.7 | -0.03 | -0.47 | 135 | | 8.2485 | 82.485 | 206.2125 |
| 19.1 | -43.7 | -0.03 | -0.47 | 140 | | 8.708 | 87.08 | 217.7 |
| 19.1 | -43.7 | -0.03 | -0.47 | 145 | | 9.1785 | 91.785 | 229.4625 |
| 19.1 | -43.7 | -0.03 | -0.47 | 150 | | 9.66 | 96.6 | 241.5 |

*FIG. 11*

Aluminum and Copper

| a1 | b1 | a2 | b2 | temperature C | | emf in millivolts | emf in millivolts | emf in millivolts |
|---|---|---|---|---|---|---|---|---|
| | | | | | | one layer | ten layers | 25 layers |
| -0.047 | 0.003 | 2.76 | 0.012 | 25 | | 0.858125 | 8.58125 | 21.45313 |
| -0.047 | 0.003 | 2.76 | 0.012 | 100 | | 13.7375 | 137.375 | 343.4375 |
| -0.047 | 0.003 | 2.76 | 0.012 | 125 | | 21.46563 | 214.6563 | 536.6406 |
| -0.047 | 0.003 | 2.76 | 0.012 | 0 | | 0 | 0 | 0 |
| -0.047 | 0.003 | 2.76 | 0.012 | 5 | | 0.034225 | 0.34225 | 0.855625 |
| -0.047 | 0.003 | 2.76 | 0.012 | 10 | | 0.13715 | 1.3715 | 3.42875 |
| -0.047 | 0.003 | 2.76 | 0.012 | 15 | | 0.308775 | 3.08775 | 7.719375 |
| -0.047 | 0.003 | 2.76 | 0.012 | 20 | | 0.5491 | 5.491 | 13.7275 |
| -0.047 | 0.003 | 2.76 | 0.012 | 25 | | 0.858125 | 8.58125 | 21.45313 |
| -0.047 | 0.003 | 2.76 | 0.012 | 30 | | 1.23585 | 12.3585 | 30.89625 |
| -0.047 | 0.003 | 2.76 | 0.012 | 35 | | 1.682275 | 16.82275 | 42.05688 |
| -0.047 | 0.003 | 2.76 | 0.012 | 40 | | 2.1974 | 21.974 | 54.935 |
| -0.047 | 0.003 | 2.76 | 0.012 | 45 | | 2.781225 | 27.81225 | 69.53063 |
| -0.047 | 0.003 | 2.76 | 0.012 | 50 | | 3.43375 | 34.3375 | 85.84375 |
| -0.047 | 0.003 | 2.76 | 0.012 | 55 | | 4.154975 | 41.54975 | 103.8744 |
| -0.047 | 0.003 | 2.76 | 0.012 | 60 | | 4.9449 | 49.449 | 123.6225 |
| -0.047 | 0.003 | 2.76 | 0.012 | 65 | | 5.803525 | 58.03525 | 145.0881 |
| -0.047 | 0.003 | 2.76 | 0.012 | 70 | | 6.73085 | 67.3085 | 168.2713 |
| -0.047 | 0.003 | 2.76 | 0.012 | 75 | | 7.726875 | 77.26875 | 193.1719 |
| -0.047 | 0.003 | 2.76 | 0.012 | 80 | | 8.7916 | 87.916 | 219.79 |
| -0.047 | 0.003 | 2.76 | 0.012 | 85 | | 9.925025 | 99.25025 | 248.1256 |
| -0.047 | 0.003 | 2.76 | 0.012 | 90 | | 11.12715 | 111.2715 | 278.1788 |
| -0.047 | 0.003 | 2.76 | 0.012 | 95 | | 12.39798 | 123.9798 | 309.9494 |
| -0.047 | 0.003 | 2.76 | 0.012 | 100 | | 13.7375 | 137.375 | 343.4375 |
| -0.047 | 0.003 | 2.76 | 0.012 | 105 | | 15.14573 | 151.4573 | 378.6431 |
| -0.047 | 0.003 | 2.76 | 0.012 | 110 | | 16.62265 | 166.2265 | 415.5663 |
| -0.047 | 0.003 | 2.76 | 0.012 | 115 | | 18.16828 | 181.6828 | 454.2069 |
| -0.047 | 0.003 | 2.76 | 0.012 | 120 | | 19.7826 | 197.826 | 494.565 |
| -0.047 | 0.003 | 2.76 | 0.012 | 125 | | 21.46563 | 214.6563 | 536.6406 |
| -0.047 | 0.003 | 2.76 | 0.012 | 130 | | 23.21735 | 232.1735 | 580.4338 |
| -0.047 | 0.003 | 2.76 | 0.012 | 135 | | 25.03778 | 250.3778 | 625.9444 |
| -0.047 | 0.003 | 2.76 | 0.012 | 140 | | 26.9269 | 269.269 | 673.1725 |
| -0.047 | 0.003 | 2.76 | 0.012 | 145 | | 28.88473 | 288.8473 | 722.1181 |
| -0.047 | 0.003 | 2.76 | 0.012 | 150 | | 30.91125 | 309.1125 | 772.7813 |

*FIG. 13*

THERMALTRONIC ANALOG DEVICE

RELATED APPLICATIONS

This application is a Continuation-in-part of a patent application entitled, THERMAL ELECTRIC NOR GATE, invented by Joseph Patterson, Ser. No. 12/120,109, filed May 13, 2008, now U.S. Pat. No. 7,659,750;

which is a Continuation-in-part of a patent application entitled, THERMAL ELECTRIC LOGIC CIRCUIT, invented by Joseph Patterson, Ser. No. 12/040,765, filed Feb. 29, 2008, now U.S. Pat. No. 7,564,267;

which is a Continuation-in-part of a pending patent application entitled, SOLID STATE THERMAL ELECTRIC LOGIC, invented by Joseph Patterson, Ser. No. 12/032,549, filed Feb. 15, 2008. All of the above-mentioned applications are incorporated herein by reference.

BACKGROUND OF THE INVENTION

1. Field of the Invention

This invention generally relates to analog signal processing and, more particularly, to a solid state thermaltronic analog device made from thermal electric components instead of semiconductor transistors.

2. Description of the Related Art

Three-element (cathode/grid/plate) triode tubes and transistors are widely understood electronic devices used for signal processing and logic operations. It is obvious the transistors are a cornerstone of modern technology. However, designers are beginning to bump against physical limitations associated with transistors which impede circuit size and performance. For example, transistor device sizes are limited by the thickness of the gate insulation that can be formed. However, thin oxide layers are sensitive to contamination and break down voltages. More generally, transistors are subject to failure when exposed to electromagnetic pulses (EMP), cosmic rays, electrostatic discharge (ESD), and Alpha particle radiation. Further, many of the processes associated with conventional complementary metal oxide semiconductor (CMOS) integrated circuits (ICs) are complicated, use high process temperatures, involve the use of poisonous materials, and expensive fabrication equipment.

It would be advantageous if analog devices, such as simple transistors, and the more complex devices conventionally made from transistor networks, could be made with a technology other than solid state semiconductor transistors.

SUMMARY OF THE INVENTION

Disclosed herein are solid state electronic analog devices and circuit elements requiring no active semiconductor diodes, transistors, or vacuum tubes that can be configured into basic circuit blocks performing linear functions including differential comparison, linear amplification, and operational amplifier functions. These thermaltronic devices can be made without expensive semiconductor processing, making them free of failure due to defects in thin oxides, insensitive to contamination, and able to operate over a wide range of supply voltages, from volts down to the tens of millivolt range. The thermaltronic devices are highly insensitive to Electro-magnetic pulses (EMP), electrostatic discharge, cosmic rays, and Alpha particles.

Because only lower temperature "back end" processing steps are utilized, multiple active layers and connective layers can be stacked vertically on the same substrate for 3D construction, permitting high density circuits to be fabricated. Since fewer steps are involved, fewer types of chemicals are used, and a lower volume of chemicals are required. Also, because of the lower temperatures, less energy is consumed in the manufacturing.

Accordingly, a method is provided for the electronic processing of analog signals in a thermaltronic device. The method accepts an analog input signal, e.g., an AC signal, at a thermaltronic device input and generates a thermal electric (TE) temperature having a first transfer function responsive to the input signal. As opposed to having a digital response, the transfer function is either linear or logarithmic. An analog output signal, e.g., an AC signal, is generated having a second transfer function responsive to the TE, which is likewise either linear or logarithmic.

In one aspect, the TE temperature is generated using a thermal electric input stage connected between an input signal interface and a signal source/sink interface. The thermal electric input stage generates the TE temperature in response to conducting a signal between the input signal interface and the signal source/sink interface. Typically, the thermal electric input stage is made from a material having the first transfer function in a first range of temperatures, and the TE input stage is temperature biased to be in the first range of temperatures.

In another aspect, the output signal is generated using a thermopile output stage having a conduction path connected between a signal sink interface and a signal source interface, and an output signal interface. The thermopile output stage varies the voltage potential in the conduction path, and so the output signal, in response to the TE temperature. The thermopile output stage may be made from a material having the second transfer function in a second range of temperatures, and it can be temperature biased to operate in the second temperature range.

Additional details of the above-described method and a thermaltronic analog device are provided below.

BRIEF DESCRIPTION OF THE DRAWINGS

FIG. 11 is table listings constants associated with the emf of a nickel and bismuth thermopile of 1 layer, 10 layers, and 25 layers, at different temperatures.

FIG. 13 is table listing constants associated with the emf of an aluminum and copper thermopile of 1 layer, 10 layers, and 25 layers, at different temperatures.

DETAILED DESCRIPTION

Figure 8:
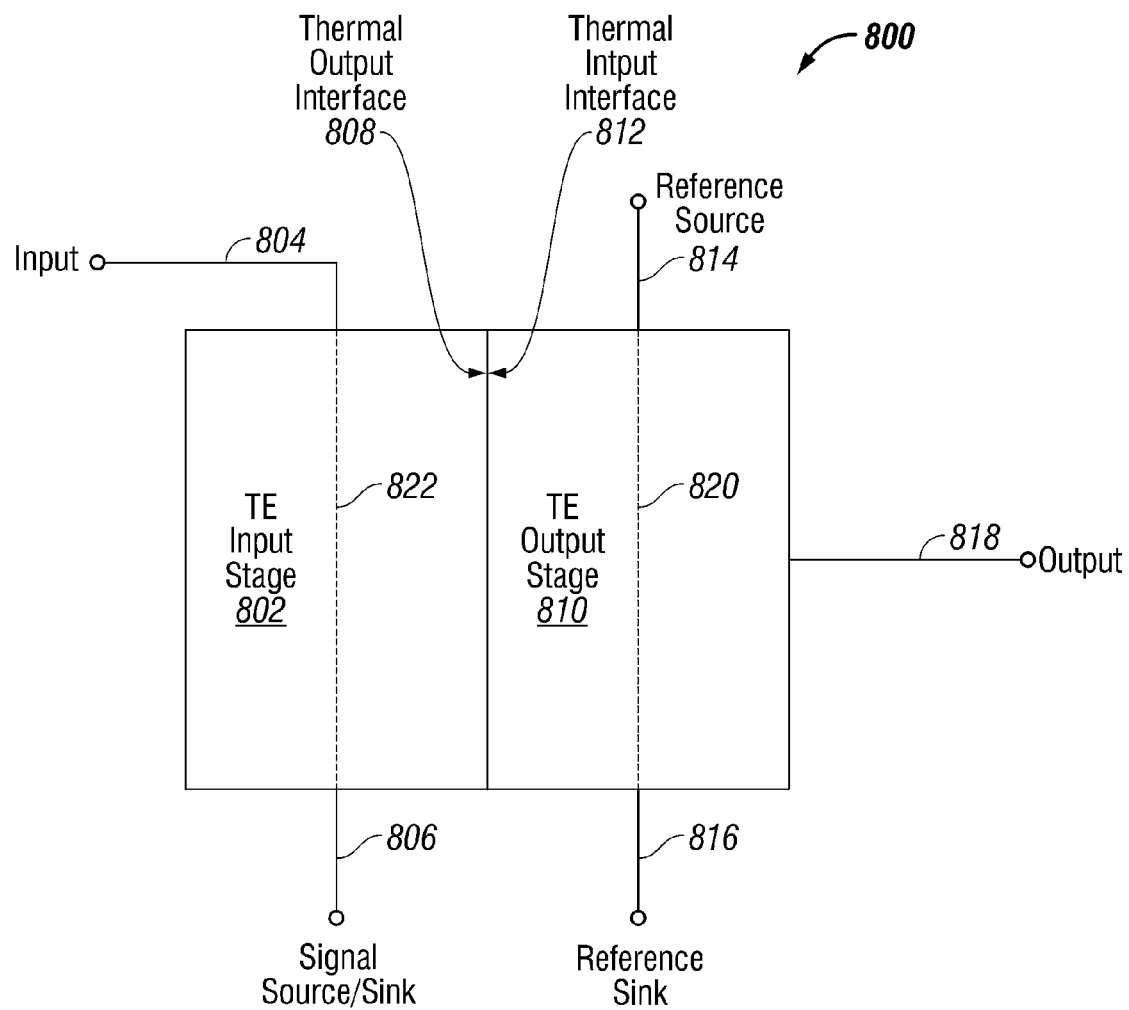
FIG. 8 is a schematic diagram of a thermaltronic analog device.

FIG. 8 is a schematic diagram of a thermaltronic analog device. The thermaltronic analog device 800 comprises a thermal electric (TE) input stage 802 having an input interface on line 804 to accept an analog input signal, an interface on line 806 to accept a source/sink signal, and a thermal output interface 808 to supply a TE temperature. The TE temperature has a first transfer function with respect to the input signal that can be either linear or logarithmic. Typically, the source/sink signal is a reference voltage or reference current. Note: the input and output signals may be considered as either voltage or current signals, depending on the context.

A thermopile (TP) output stage 810 has a thermal input interface 812, a reference signal source interface on line 814, a reference signal sink interface on line 816, and an output on line 818 to supply an analog output voltage. Again, the source and sink may be either reference voltages or reference currents. The output voltage has a second transfer function with respect to the TE temperature that is either linear or logarithmic. Note: the first and second transfer functions need not be the same. If both functions are logarithmic, they need not have the same response.

For example, the TE input stage 802 may accept an alternating current (AC) input signal and the thermopile output stage 810 may supply an AC output signal. Generally, the thermopile output stage 810 supplies an output voltage on line 818 having a relationship to the input voltage on line 804 that is inverting, non-inverting, voltage gain, voltage attenuation, current gain; current attenuation, unity voltage gain, or unity current gain, to name a few examples of analog process. Other analog relationships are known in the art.

Figure 1A:
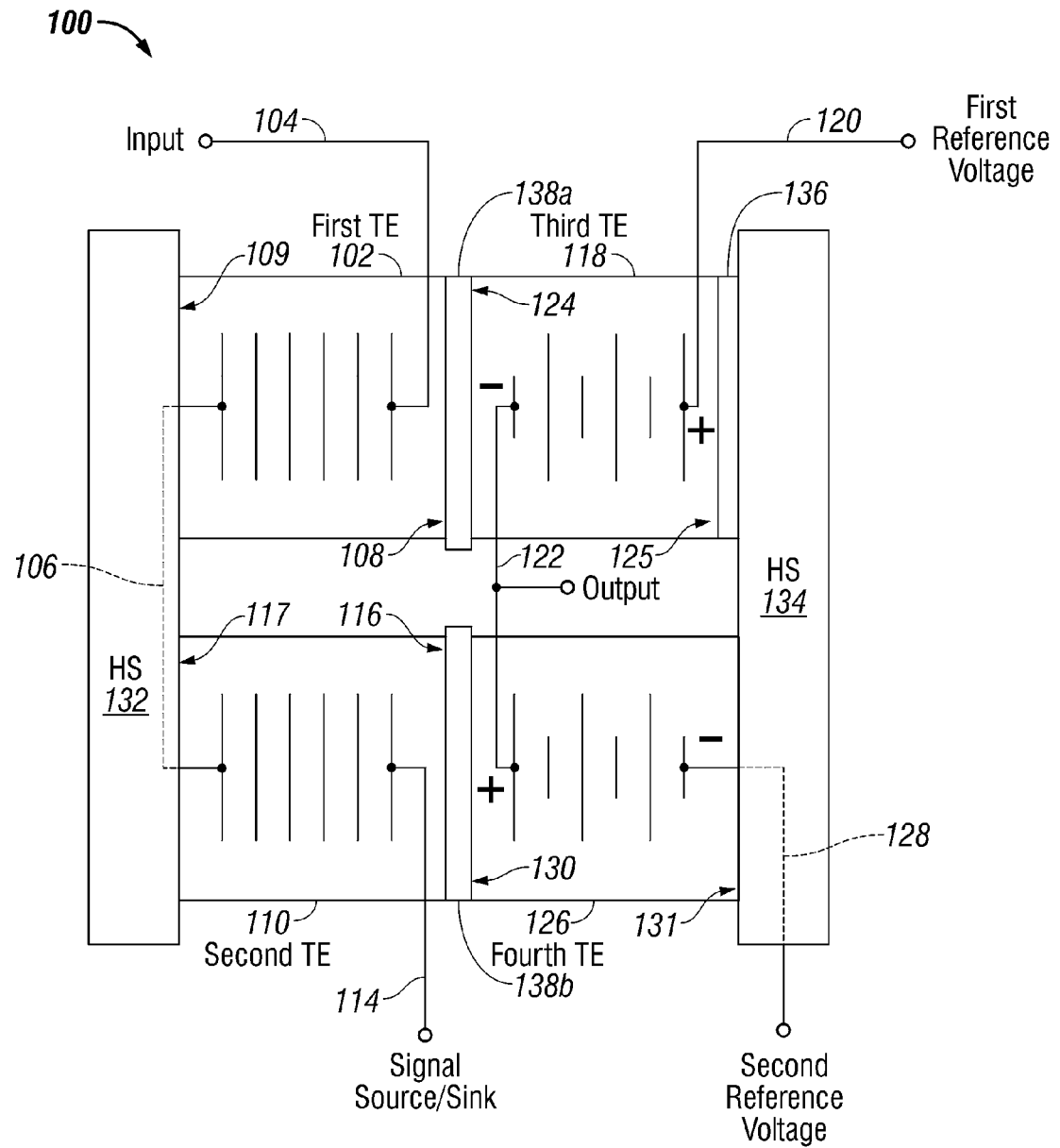
FIGS. 1A and 1B are schematic block diagrams of quad-TE thermaltronic devices.
Figure 1B:
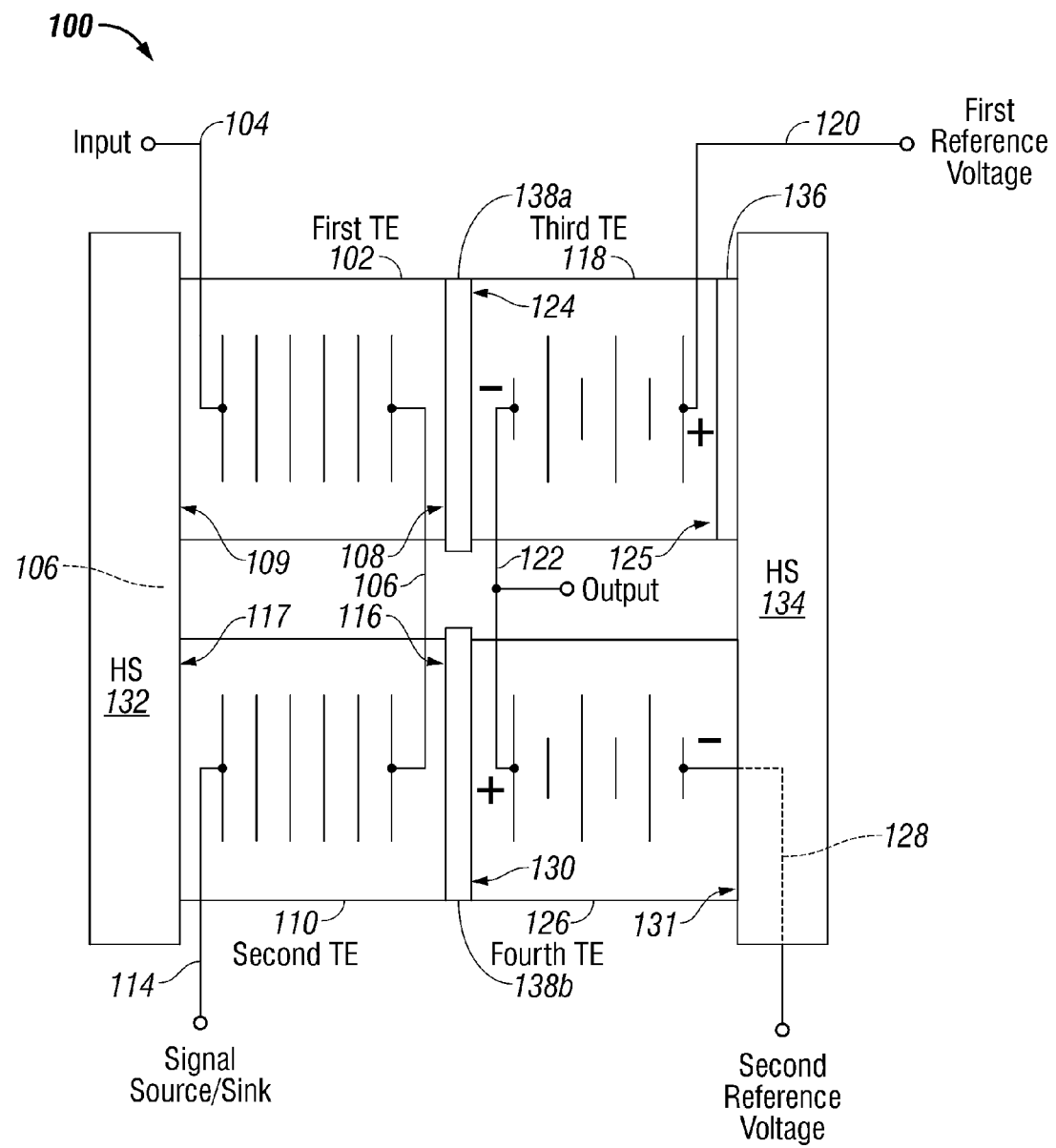

Generally, the TE input stage 802 and thermopile output stage 810 are a combination that act as either a non-inverting or inverting thermaltronic device. As explained in more detail below, some examples of non-inverting and inverting thermaltronic devices designs include a single TE/thermistor divider with decoupled input/output voltages (see FIG. 5), a TE thermal divider/thermistor divider with decoupled input/output voltages (see FIG. 6), and a quad-TE (FIGS. 1A and 1B). Other design examples are also presented below.

The thermopile output stage 810 includes a conduction path (shown as a dotted line) 820 between the reference signal source interface on line 814 and the reference signal sink interface on line 816, with a voltage potential that varies in response to the TE temperature. The thermopile output stage 810 supplies an output voltage on line 818 responsive to the varying voltage potential. The TE input stage 802 generates the TE temperature in response to conducting a signal along a thermal conduction path 822 between the input interface on line 804 and the signal source/sink interface on line 806.

Figure 9:
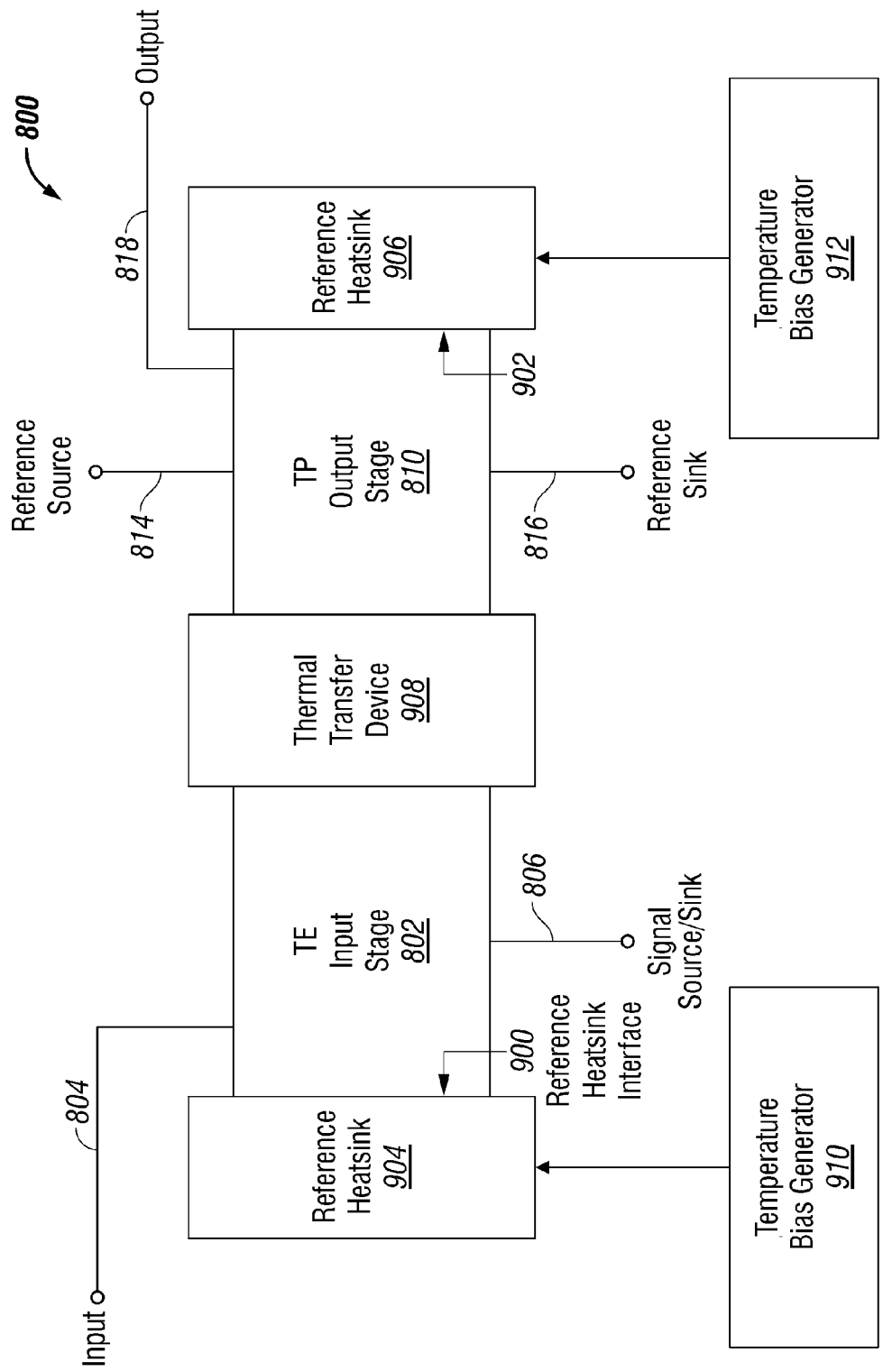
FIG. 9 is a schematic diagram showing a variation of the thermaltronic device of FIG. 8.

FIG. 9 is a schematic diagram showing a variation of the thermaltronic device of FIG. 8. In this aspect, the TE input stage 802 has a reference heatsink interface 900, and the thermopile output stage 810 has a reference heatsink interface 902. The thermaltronic device 800 further comprises a first reference heatsink 904 interfacing to the TE input stage reference heatsink interface 900. A second reference heatsink 906 interfaces to the thermopile output stage reference heatsink interface 902. Also shown is a thermal transfer device 908 interposed between the TE input stage thermal output interface 808 and the thermopile output stage thermal input interface 812.

For example, the thermal transfer device 908 may be a conductive metal. In another aspect, the thermal transfer device is a poor conductor, so as to provide a negative temperature offset or delayed response between the TE input stage 802 and the thermopile output stage 810. In another aspect, the thermal transfer device is an active device providing a positive temperature offset between the TE input stage 802 and the thermopile output stage 810. In a different aspect, when the TE input stage 802 and the thermopile output stage are not adjacent, the thermal transfer device measures the TE temperature at the TE input stage 802 and provides the same (or offset) TE temperature to the thermopile output stage 810. Alternately, the thermal transfer device 908 may have a linear or logarithmic transfer function, so that the output signal is responsive to three transfer functions.

The TE input stage 802 is made from a first material having the first transfer function in a first range of temperatures. In more complicated variations, the TE input stage 802 is made from a combination or layering of materials, so that the first transfer function is responsive to more than one material. Likewise, the thermopile output stage 810 is made from a second material, or a combination of materials, having the second transfer function in a second range of temperatures.

A first temperature bias generator 910 is thermally interfaced to the first reference heatsink 904 to supply a temperature in the first range. A second temperature bias generator 912 is thermally interfaced to the second reference heatsink 906 to supply a temperature in the second range. In one aspect, the temperature bias generators measure the temperature of the reference heatsinks and supply a regulated temperature.

FIGS. 1A and 1B are schematic block diagrams of quad-TE thermaltronic devices. FIG. 1A is an inverter and FIG. 1B is a non-inverter. As noted in parent application Ser. No. 12/120,109, these circuits can be used to process digital signals. However, these circuits can also be adapted to process analog signals.

Circuit 100 comprises a first thermal electric (TE) element 102 having a first electrical interface connected on line 104 to accept an input voltage and a second electrical interface connected on line 106. The first TE element 102 has a thermal interface 108 to supply a first temperature responsive to the input voltage on line 104 and a second thermal interface 109. A second TE element 110 has a first electrical interface, electrically connected to the first TE second electrical interface on line 106, and a second electrical interface connected with line 114 to a current source/sink. The signal source/sink reference is on line 114. The second TE element 110 has a thermal interface 116 to supply a second temperature responsive to the input signal and a thermal interface 117. The signal source/sink on line 114 may be either a voltage or current reference.

As explained in more detail below, the TE electrical interfaces are typically connected to opposite ends of a thermocouple or thermal pile. Lines in the TE elements are intended to represent a stack of alternating materials, which is how most thermocouples are manufactured. In some aspects, it is assumed for simplicity that thermal and electrical interfaces are a common interface, or that the electrical connections are made to the TE through the thermal interfaces. As explained in more detail below, a TE element is defined as an element that relies upon the Peltier effect to convert current into temperature, and a series of thermocouples (a thermopile) exhibiting the Seebeck effect, which is the result of two Peltier electromotive forces (emfs) and two Thomson emfs.

When input current flows from the input on line 104 to the current sink on line 114 (FIG. 1A), the thermal interface 108 increases in temperature and thermal interface 116 decreases in temperature. When current flows from the source/sink on line 114 to the input on line 104, thermal interface 116 increases in temperature and thermal interface 108 decreases in temperature. In FIG. 1B, current flow from the input on line 104 causes the thermal interface 108 to decrease, while thermal interface 116 increases in temperature. When current flows from the source/sink on line 114 to the input on line 104, thermal interface 116 decreases in temperature and thermal interface 108 increases in temperature. The combination of the first TE 102 and second TE 110 may be referred to as the TE input stage of FIGS. 8 and 9.

A third TE element 118 has a first electrical interface connected on line 120 to a first reference source (e.g., voltage) and a second electrical interface connected on line 122 to supply an output voltage. The third TE element 118 has a thermal interface 124 thermally connected to the first TE element thermal interface 108 and a thermal interface 125 thermally connected to heatsink 134. A fourth TE element 126 has a first electrical interface connected on line 122 to the third TE element second electrical interface, and a second electrical interface connected on line 128 to a second reference sink (e.g., voltage). The fourth TE element 126 has a thermal interface 130 thermally connected to the second TE element thermal interface 116 and a thermal interface 131 thermally connected to heatsink 134.

A first heatsink (HS) 132 is thermally connected to the first TE element thermal interface 109 and to the second TE element thermal interface 117. In the aspect shown, the first HS 132 is electrically conductive, so that the electrical connection on line 106 (shown as a dotted line) is made through the HS in FIG. 1B. Alternately but not shown, the first and second TE elements may be electrically isolated from HS 132, and electrical connection represented by line 106 in FIG. 1B is made independent of the heatsink. In another aspect, the heatsink is not electrically conductive.

A second heatsink 134 is thermally connected to the third TE element thermal interface 125 to the fourth TE element thermal interface 131. In the aspect shown, the second HS 134 is electrically conductive, so that the electrical connection on line 128 (shown as a dotted line) is made through the HS. To isolate the first and second voltages, a thermally conductive electrical insulator 136 may be interposed between HS 134 and the third TE element first electrical interface connected on line 120. A thermally conductive electrical insulator 138a is interposed between the first TE element 102 and the third TE element 118. Likewise, a separate insulator 138b is interposed between the second TE element 110 and the fourth TE element 126. The combination of the third TE 118 and fourth TE 128 may be referred to as a thermopile output stage (see FIGS. 8 and 9).

In the aspect shown in FIG. 1A, the first TE element first electrical interface connected on line 104 and thermal interface 108 are substantially the same interface. That is, line 104 is connected in close proximity to thermal interface 108. In some aspects, it is assumed for simplicity that thermal and electrical interfaces are a common interface, or that the electrical connections are made to the TE through the thermal interfaces. Alternately stated, a thermal interface may act as an electrical interface. The close proximity of interfaces permits changes in temperature resulting from TE current flow to be more directly sensed at the proximate thermal interface. Also in FIG. 1A, the second TE element second electrical interface connected on line 114 and thermal interface 116 are substantially the same interface. Assuming that the first voltage reference has a higher potential than the second voltage reference, the output signal is inverted from the input signal. Alternately, if the first voltage reference has a lower potential than the second voltage reference, then the third TE element second electrical interface connected on line 122 supplies a signal non-inverted from the input signal. The above-described circuits are examples of a quad-TE inverter or non-inverter circuits. Additional examples of quad-TE circuits can be found in parent application Ser. No. 12/040,765 (see FIGS. 1-3).

In one aspect, the third TE and the fourth TE have positive and negative polarities. For example, the third TE 118 may have its positive polarity end on line 120, assuming that the first reference voltage has a higher potential than the second reference voltage. The fourth TE 126 has its negative polarity end connected to line 128. For simplicity, TE elements having a polarity have been represented as composed of alternating long and short lines. For consistency in this disclosure, the positive polarity end of the TEs is shown associated with a long line. In contrast, the first and second TEs 102 and 110 are shown without polarities. While the voltage-to-heat conversion function may benefit from the use of a polarity TE, their use is not critical. TE elements drawn with uniform length lines are intended to represent TEs without a polarity, or polarity TEs that will function regardless of how that are connected. A more detailed discussion of polarity can be found in parent application Ser. No. 12/120,109.

The performance of thermal electric devices is based upon two effects: the Peltier effect and the Thomson effect. The Peltier effect defines the results when a single junction, made from two different materials, is joined and a current is sent through the junction while the thermal electric device ends are maintained at constant temperature. Under these conditions a heat flow takes place between the junction and it surroundings. The amount of Peltier heat transferred at any junction is proportional to the current through the junction and that the transfer reverses direction when the direction of the current is reversed. Such a junction is a source within which electrical energy is converted to heat, or heat is converted to electrical energy. The Peltier emf developed across a junction made from materials "a" and "b" is defined as the heat absorbed or liberated per unit quantity of electricity crossing the junction. Mathematically, $Pemf$=Peltier Heat/Charge transfer.

The Thomson effect describes the behavior of a wire made from a single material with an electrical current passed down its length and the ends of the wire are at different temperatures. Under these conditions, the density of free electrons varies from point-to-point along the wire length, and heat is absorbed or liberated at all points down the wire. The "Thomson Heat" is proportional to the quantity of electricity passing through a section of wire and to the temperature difference between the ends of the section. The Thomson Heat is also reversible and depends on the nature of the wire and the average temperature of the section of the wire.

A thermal couple (thermocouple) consists of two wires of different materials that form two junctions. Thus, a thermal couple is made of two Peltier junctions and two wires exhibiting the Thomson effect. A thermal couple emf is the combination of these two effects. A thermopile is a device consisting of many thermal couples connected in series. The total emf of the thermopile is the sum of all the individual thermal couples.

The fundamental principle behind the behavior of all of these devices is the Seebeck Effect and is attributed to the fact that the density of free electrons is different for different materials, and within the same material, the density of free electrons is different at different temperatures.

The difference in free electron density results in a difference in force. The greater the free electron density, the greater is the force. The nature of the force is the electrostatic charge of the electron. Since the force is cumulative, more electrons per unit area or volume mean that the force is greater. For different materials forming a junction, the greater the difference in free electron density, the greater the emf. The emf is a thermal emf and called a Seebeck emf, after Thomas Johann Seebeck.

In an attempt to correct the imbalance of force at the junction, a current is enabled (charge transfer across the junction). The principles of physics state that a system always moves in a direction to lower its energy state. In this case, the system is a section of wire or a junction of two materials. A hotter section of wire is at a higher energy state and the electrons in the hotter section of wire are in a higher energy state. Thermal energy is the kinetic energy (energy of motion) of the material including the electrons. Electrons can carry thermal energy and move from a higher energy state to a lower energy state. In other words, the electrons move from a hotter portion of the wire to a colder portion, carrying the heat away with them. Thus, TE elements act to bring into balance unequal forces due to the difference in free electron density resulting from temperature (or material differences in the case of a junction).

The above-mentioned principles are also at work in the operation of a semiconductor junction. The built-in potential of a semiconductor junction is a result of the difference in charge density of the two materials on the opposite sides of the junction. The charge density on the N-type side (free electron density due to impurity doping), and the different charge density and polarity of the holes on the P-type side (again due to impurity doping) results in an imbalance in electrostatic forces at the junction. In an attempt to correct the imbalance, charge is transferred across the junction and a built-in electric field results. This built-in field is measured externally as the forward diode drop of the semiconductor junction. It is also a thermal emf and changes with temperature.

However, a Peltier heater/cooler can be distinguished from a semiconductor junction. For example, a bismuth-telluride TE is a bulk piece of BiTe doped with Antimony to make it N-type, with another bulk piece of BiTe doped to make it P-type. The two separate pieces are attached together, usually with solder, to form the completed TE element. There is no diode junction and it is not rectifying. The semiconductor material enhances the Peltier effect just as bismuth has the most favorable thermal electric effect properties for a pure metal.

Although a thermocouple can be distinguished from a semiconductor junction (transistor type junction), it is technically possible for a semiconductor junction to be used as a TE element, as it can be used to convert current to temperature, and temperature to voltage, without the conventional transistor action that produces an inverted signal.

The TE elements described in FIGS. 1A and 1B may be enabled as thermocouples, or thermopiles made from alternating layers of bismuth and nickel, or bismuth and copper. Bismuth has the highest thermal electric properties of any metal. The stack of layers may be interdigitated metals. Thermocouples can also be made from tellurium, which when doped, is a semiconductor. In one aspect, bismuth-telluride layer may be stacked between a metal such as copper. Alternately, the TE elements may be a stack of layers made from a single material. The circuitry of FIGS. 1A and 1B are not limited to any particular thermocouple design or materials.

FIG. 11 is table listing constants associated with the emf of a nickel and bismuth thermopile of 1 layer, 10 layers, and 25 layers, at different temperatures. The emf is calculated as follows:

$$emf=(a1-a2)t+\tfrac{1}{2}(b1-b2)t^2, \text{ where}$$

t=temperature (C);
a1 and b1 are constants associated with nickel; and,
a2 and b2 are constants associated with bismuth.

Figure 12:
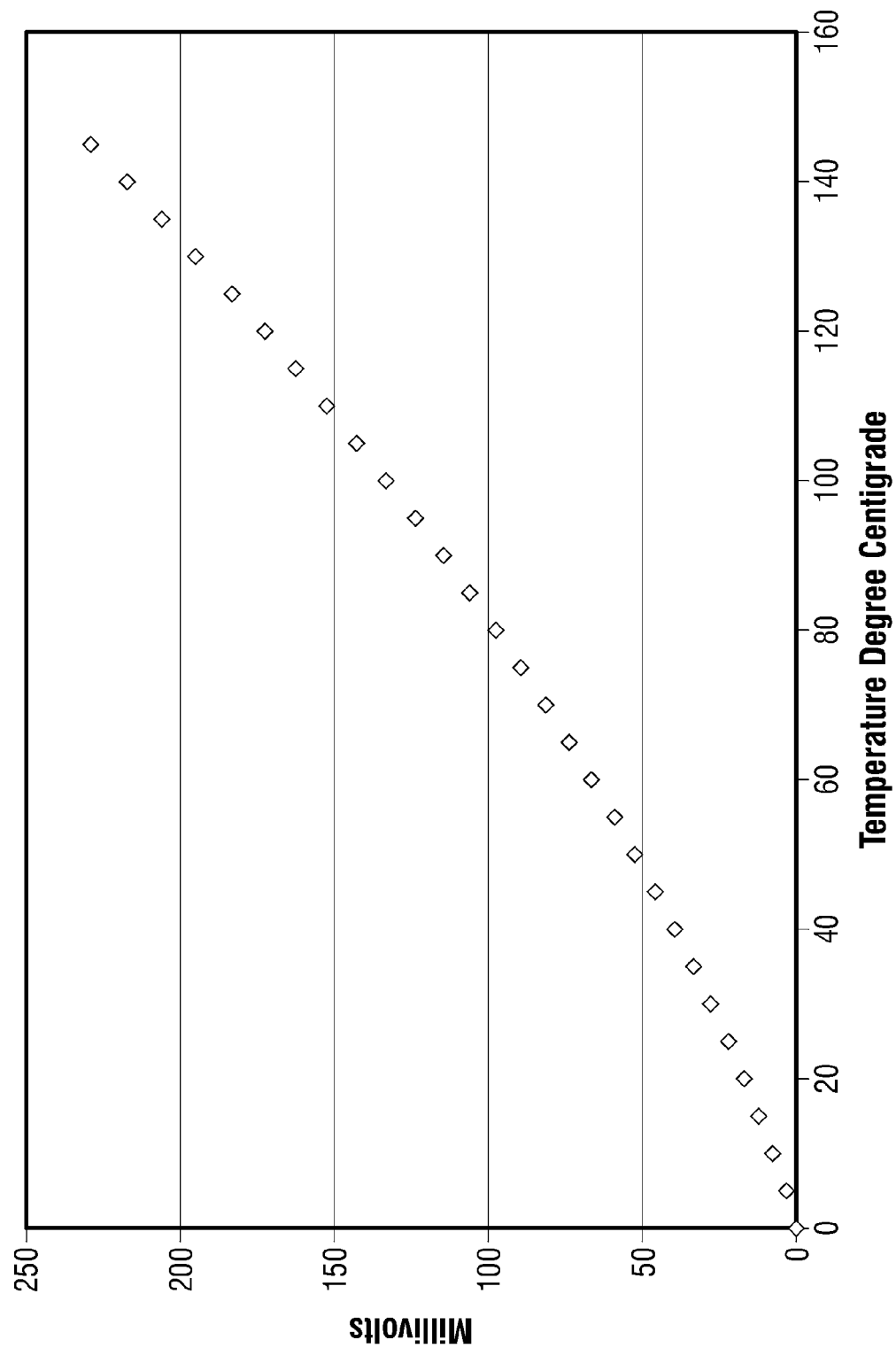
FIG. 12 is a diagram depicting a logarithmic (exponential) relationship between voltage and temperature in a 25-layer nickel and bismuth TE device.

FIG. 12 is a diagram depicting a logarithmic (exponential) relationship between voltage and temperature in a 25-layer nickel and bismuth TE device.

FIG. 13 is table listing constants associated with the emf of an aluminum and copper thermopile of 1 layer, 10 layers, and 25 layers, at different temperatures. The emf formulas are as above.

Figure 14:
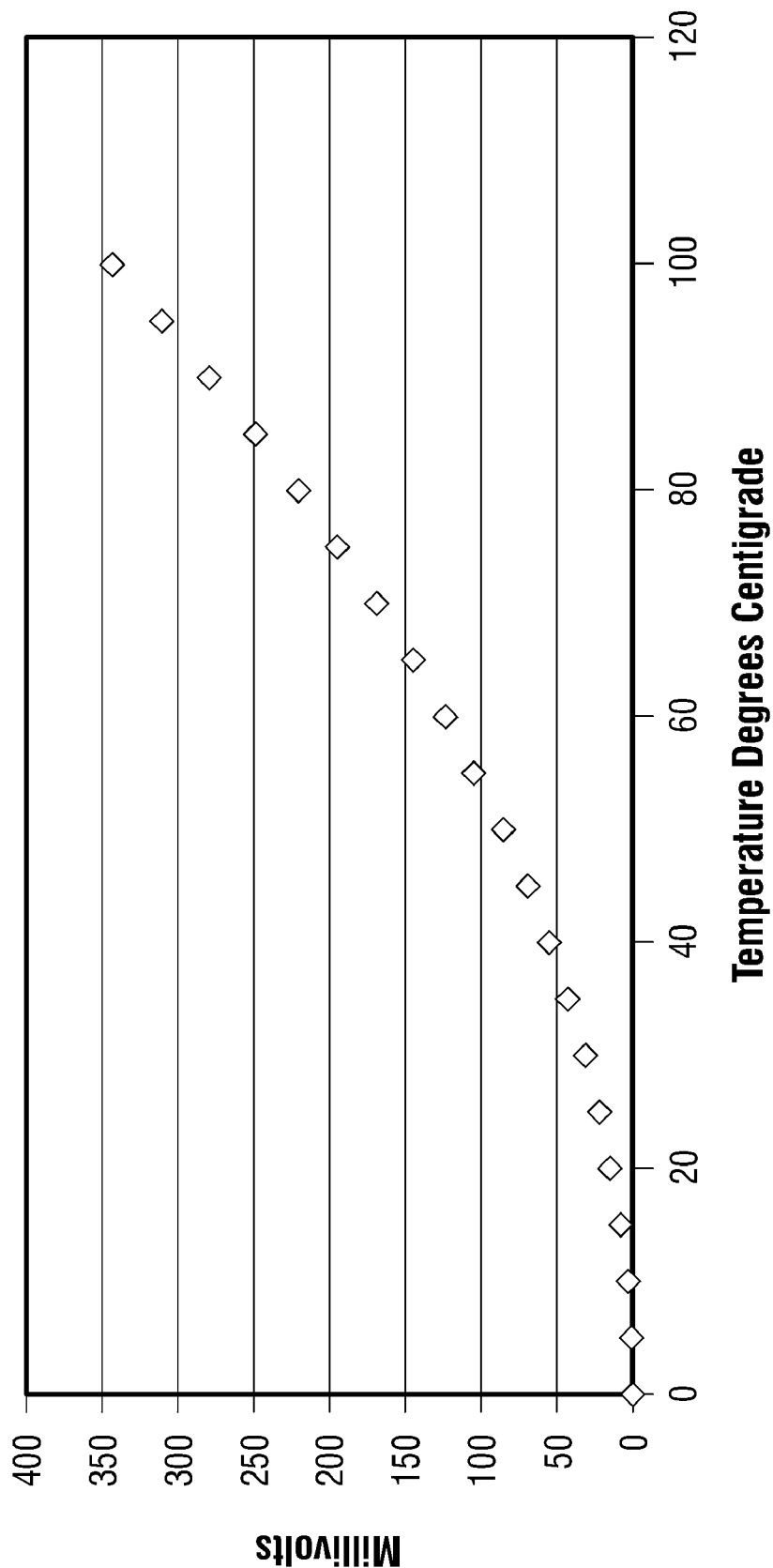
FIG. 14 is a diagram depicting a linear relationship between voltage and temperature in a 25-layer aluminum and copper TE device.

FIG. 14 is a diagram depicting a linear relationship between voltage and temperature in a 25-layer aluminum and copper TE device.

Figure 2:
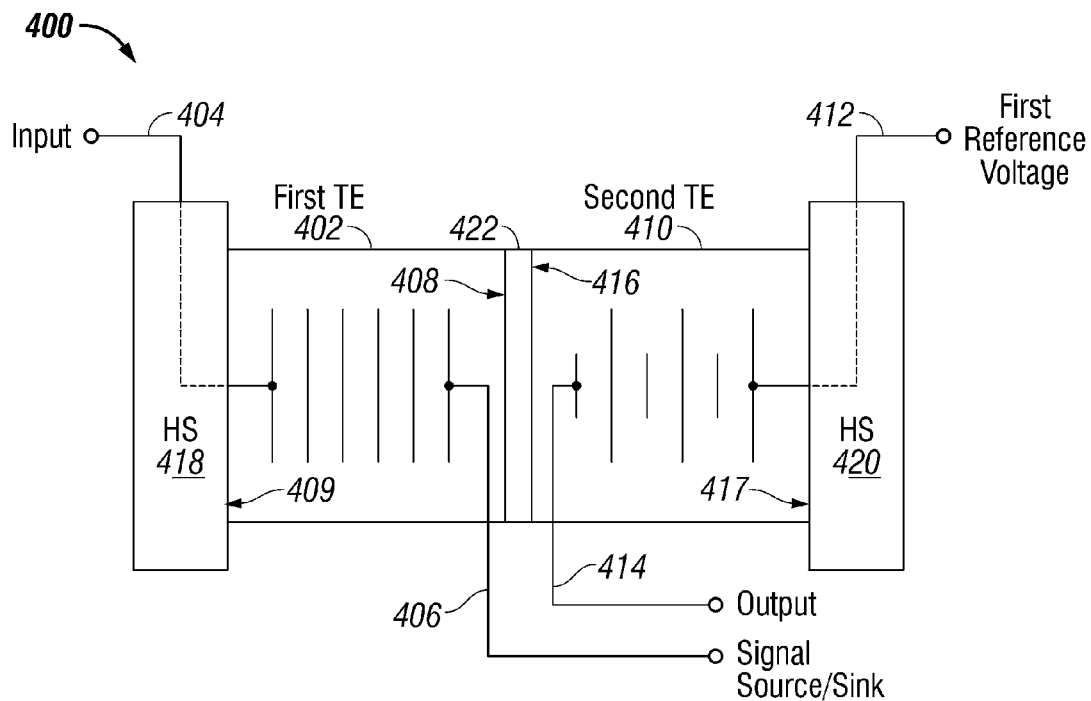
FIG. 2 is a schematic block diagram of a dual-TE thermaltronic device.

FIG. 2 is a schematic block diagram of a dual-TE thermaltronic device. The advantage of this circuit is its simplicity, but it has a more limited use that the circuits of FIGS. 1A and 1B. Other examples of dual-TE circuit designs can be found in parent application Ser. No. 12/040,765 (see FIGS. 4-6). The circuit 400 comprises a first TE element 402 having a first electrical interface connected on line 404 to accept an input voltage, and a second electrical interface connected on line 406 to a signal source/sink. The reversal of current through first TE 402 permits thermal interface 408 to become either hot or cold with respect to heatsink 418, which acts as a temperature reference.

The first TE element 402 has a thermal interface 408 to supply a first temperature responsive to the input voltage and a thermal interface 409. A second TE element 410 has a first electrical interface connected on line 412 to a first reference voltage and a second electrical interface connected on line 414 to supply an output voltage responsive to the first temperature. A thermal interface 416 is thermally connected to the first TE element thermal interface 408. A thermally conductive electrical insulator 422 is interposed between the first TE 402 and the second TE 410. A thermal interface 417 is thermally connected to heatsink 420. The first and second TEs may be a thermocouple or a thermopile. More explicitly, the first TE may be referred to as Peltier device due to its use as a temperature generator. The second TE is used as a temperature/voltage generator. When current flows from line 404 to the signal source/sink on line 406, and the thermal interface decreases in temperature. When current flows from the source/sink on line 406 to the input on line 404, and thermal interface 408 increases in temperature.

In one aspect as shown, a first heatsink 418 is thermally connected to the first TE element thermal interface 409. A second heatsink 420 is thermally connected to the second TE thermal interface 417. In this aspect, heatsinks 418 and 420 are electrically conductive and conduct current to/from the TE electrical interfaces. However, in other aspects not shown, the heatsinks may be electrically insulated from the TE elements 402 and 410. Also as shown, the first TE element second electrical interface connected to line 408 and thermal interface 408 are substantially the same interface. In some aspects, it is assumed for simplicity that thermal and electrical interfaces are a common interface, or that electrical connections are made to the TE through the thermal interfaces. The second TE element second electrical interface connected to line 414 and thermal interface 416 are substantially the same interface, and the second TE element supplies a logic signal on line 414 inverted from the input logic signal. The first TE 402 may be referred to as a TE input stage and the second TE device 410 may be referred to as a thermopile output stage (see FIGS. 8 and 9).

Figure 3:
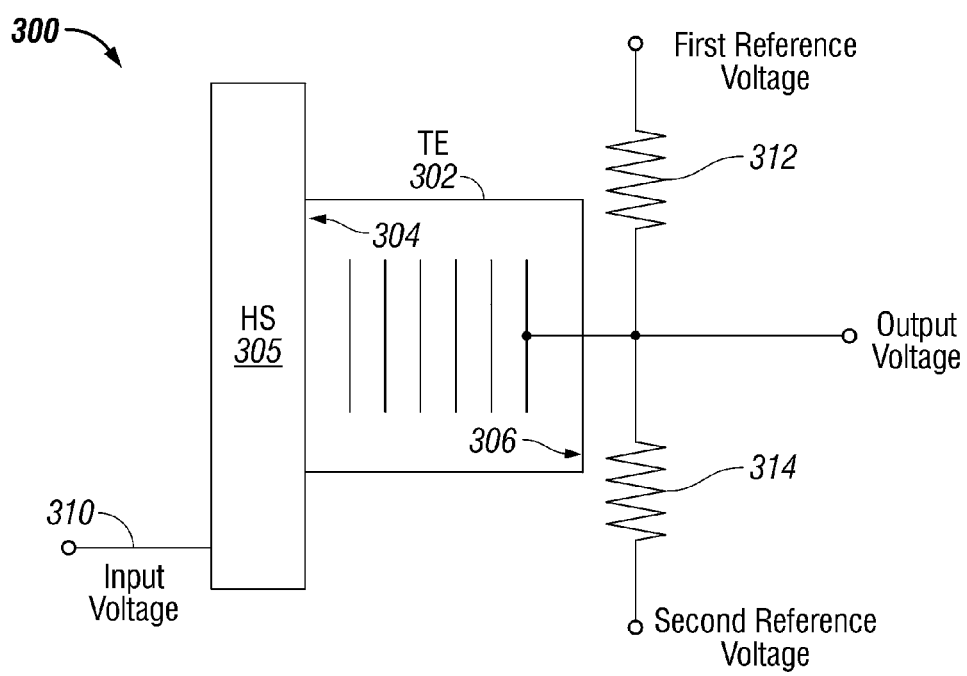
FIG. 3 is a diagram depicting an example of a single TE/thermistor divider thermaltronic device with coupled input/output voltages.

FIG. 3 is a diagram depicting an example of a single TE/thermistor divider thermaltronic device with coupled input/output voltages. The coupling between the input and output voltage can be used to modify the first and second transfer function response in some aspects. Additional examples of this circuit type can be found in parent application Ser. No. 12/032,549 (see FIG. 4). As shown, the TE element 302 has a first mechanical or thermal interface 304 mounted on a thermally conductive heatsink 305. The heatsink 305 helps maintain the first thermal interface 304 at a constant reference temperature, to help regulate the temperature range at the second thermal interface 306, which in turn helps regulate the output voltage range on line 308. As shown, the TE element first thermal interface 304 is electrically connected to the input voltage on line 310, through the electrically conductive heatsink 305. Assuming the first reference voltage is higher than the second reference voltage, if the first resistive element 312 is a negative coefficient thermistor and the second resistive element 314 is a positive coefficient thermistor, device 300 is a signal inverter.

Alternately but not shown, the TE 302 and heatsink 305 may be separated by an electrical insulator and the input voltage is introduced directly to the first thermal interface 304. The second thermal interface 306 is electrically connected to the first resistive element 312 second end. TE 302 may be referred to as a TE input stage, while resistive elements 312 and 314 may be referred to as a thermopile output stage, see FIGS. 8 and 9. Note: in this device, the combination of the first and second reference voltages act as a signal source/sink for the TE input stage (TE 302).

Figure 4:
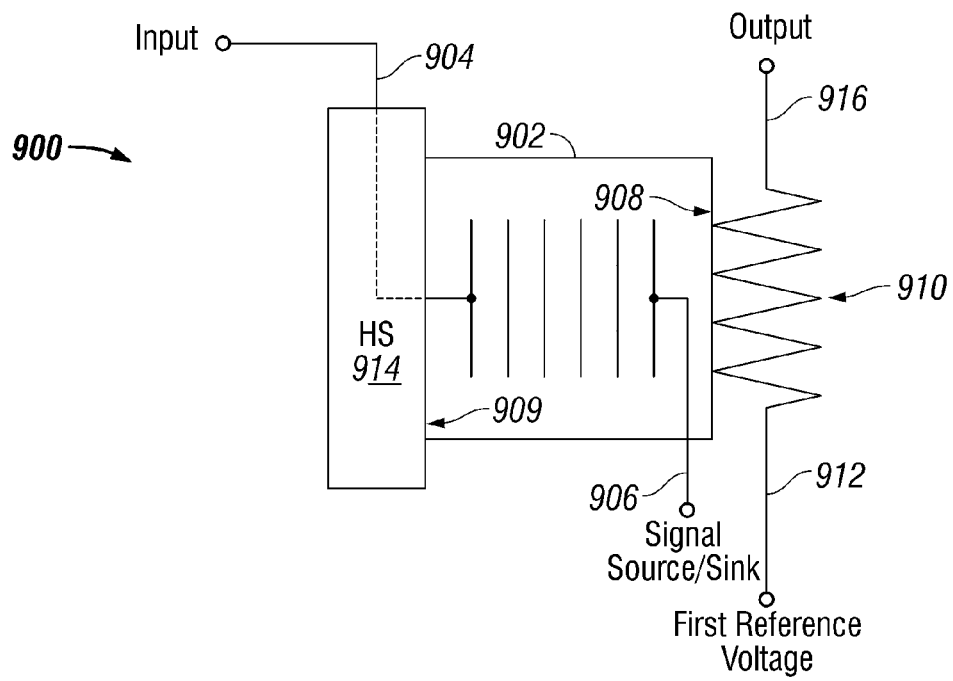
FIG. 4 is a schematic block diagram of a single TE/single thermistor thermaltronic analog device.

FIG. 4 is a schematic block diagram of a single TE/single thermistor thermaltronic analog device. The simplicity of the design can be advantageous is a number of applications. Additional examples of the single TE/single thermistor design can be found in parent application Ser. No. 12/040,765 (see FIGS. 9A and 9B). The circuit 900 comprises a TE element 902 having a first electrical interface on line 904 to accept an input voltage, a second electrical interface connected to a signal source/sink on line 906, a thermal interface 908 to supply a first temperature responsive to the input signal, and a thermal interface 909. A thermistor 910 has a first electrical interface connected to a first reference voltage on line 912, a second electrical interface on line 916 to supply an output voltage responsive to the first temperature, and a thermal interface thermally connected to the first TE element thermal interface 908. The body of the thermistor is its thermal interface. In some aspect not shown, an external pull-up or pull down resistor is connected to the output on line 916 to support current flow across thermistor 910.

The TE element second electrical interface on line 906 and thermal interface 908 are substantially the same interface. In some aspects, it is assumed for simplicity that thermal and electrical interfaces are a common interface, or that electrical connections are made to the TE through the thermal interfaces. The thermistor second electrical interface on line 916 supplies an output signal inverted from the input signal, if thermistor 910 has a positive temperature coefficient. The TE 902 is a thermocouple Peltier device, as explained in detail above. The thermistor 910 may have a positive coefficient, negative coefficient, linear coefficient, non-linear coefficient, or be a combination of the above-mentioned coefficients, depending upon the reference voltage and the desired transfer function. An electrically conductive heatsink 914 is thermally connected to thermal interface 909. Alternately but not shown, the HS may be electrically isolated from TE, or the HS may be an electrical insulator. TE 902 may be referred to as a TE input stage and resistive element 910 may be referred to as a thermopile output stage, see FIGS. 8 and 9.

Figure 5:
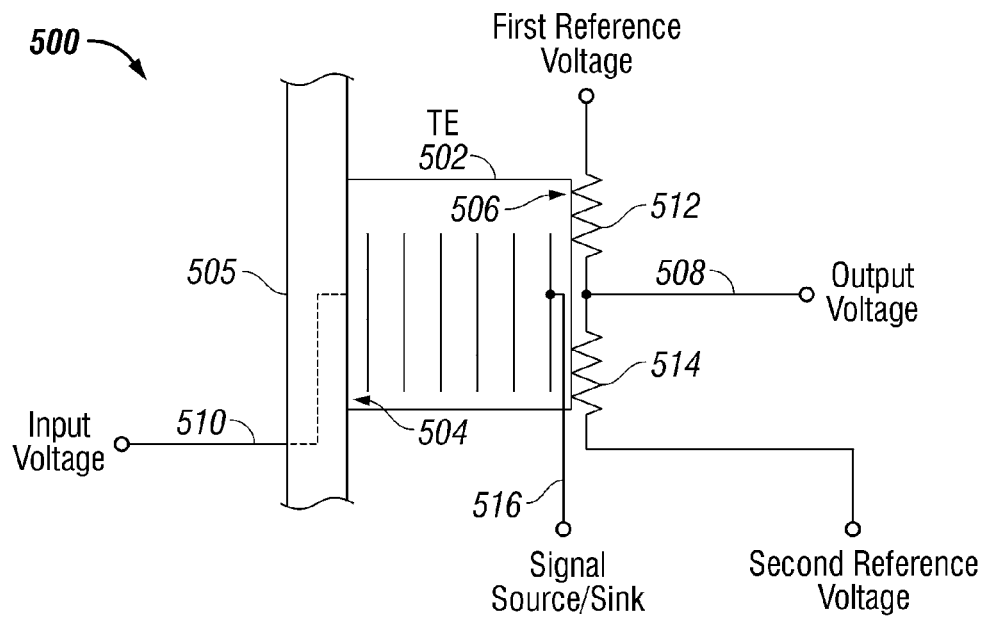
FIG. 5 is a schematic block diagram depicting a single TE/thermistor divider thermaltronic device with decoupled input/output voltages.

FIG. 5 is a schematic block diagram depicting a single TE/thermistor divider thermaltronic device with decoupled input/output voltages. Additional examples of this circuit type can be found in parent application Ser. No. 12/032,549 (see FIGS. 5A and 5B). The TE 502 is electrically connected to the input signal 510 through heatsink 505, as in FIG. 3. The TE element 502 is electrically connected to a signal source/drain on line 516. In some aspects, it is assumed for simplicity that thermal and electrical interfaces are a common interface, or that electrical connections are made to the TE through the thermal interfaces. In one aspect not shown, the second thermal interface 506 is separated from the resistive elements 512 and 514 by a thermally conductive electrical insulator.

Assuming the first reference voltage is higher than the second reference voltage, if the first resistive element 512 is a positive coefficient thermistor and the second resistive element 514 is a negative coefficient thermistor 514, device 500 is a non-inverter. In response to a current flow from lines 510 to 516, interface 506 decreases in temperature, causing the resistance across resistive element 512 to decrease, the resistance across resistive element 514 to increase, and the output voltage to go high. Alternately, if the first resistive element 512 is a negative coefficient thermistor and the second resistive element 514 is a positive coefficient thermistor, device 500 is an inverter. Current flow from line 510 to line 516 causes interface 506 to decrease in temperature. As a result, the resistance of thermistor 514 decreases and the resistance of thermistor 512 increases in temperature. Alternately but not shown, the connection of the input voltage and signal source/sink may be exchanged. TE 502 may be referred to as a TE input stage and resistive elements 512 and 514 may be referred to as a thermopile output stage, see FIGS. 8 and 9.

Figure 6:
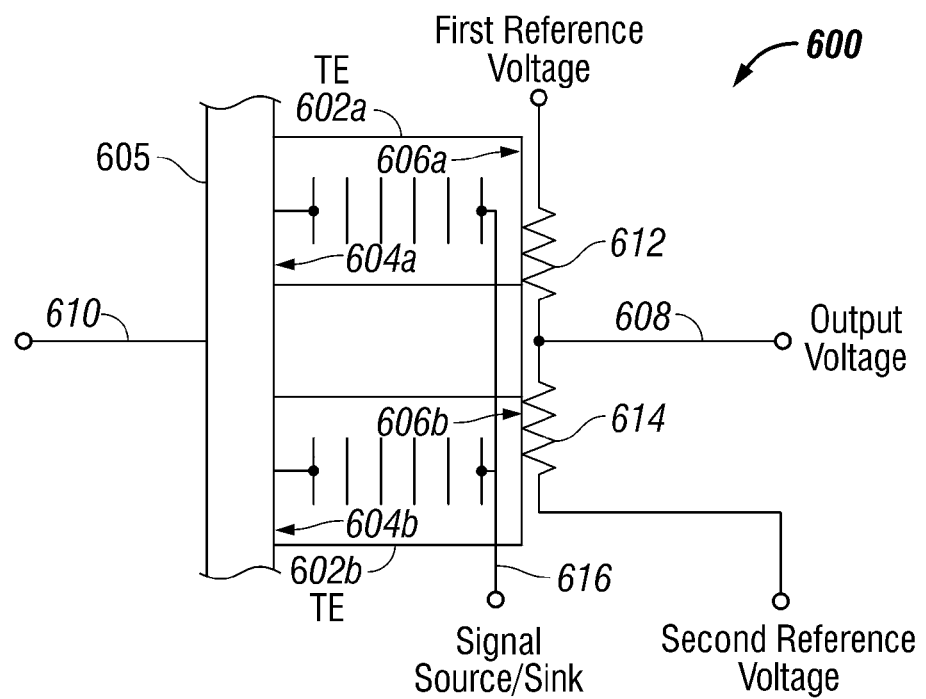
FIG. 6 is a schematic block diagram depicting a TE thermal divider/thermistor divider thermaltronic device with decoupled input/output voltages.

FIG. 6 is a schematic block diagram depicting a TE thermal divider/thermistor divider thermaltronic device with decoupled input/output voltages. Additional examples of this circuit type can be found in parent application Ser. No. 12/032,549 (see FIGS. 6A and 6B). The TE element circuit 600 includes a first TE element 602a and a second TE element 602b. Each TE element has a first thermal interface 604 to supply a first temperature in response to the input signal, and a second thermal interface 606 to supply a second temperature in response to the input signal, different than the first temperature. The input signal on line 610 is electrically connected to an electrical interface from each TE element, and the other electrical interface of each TE element is electrically connected to a signal source/drain on line 616. As shown, the TE element "other" electrical interfaces are substantially the same as thermal interfaces (606a and 606b), and are electrically connected to a signal source/drain reference on line 616. In some aspects, it is assumed for simplicity that thermal and electrical interfaces are a common interface, or that electrical connections are made to the TE through the thermal interfaces.

The first resistive element 612 is adjacent (thermally connected) to the first TE element second thermal interface 606a and the second resistive element 614 is adjacent the second TE element second mechanical interface 606b. Either resistive element may be a thermistor having a positive, negative, linear, or non-linear temperature coefficient. If both resistive elements are thermistors, they can be any combination of the above-mentioned coefficients.

As shown, the TE element first electrical interfaces are electrically connected together through heatsink 605, and the TE element second electrical interfaces are electrically connected together. If the first electrical interfaces (aligned with or proximate to thermal interfaces 604a/604b) are connected to the input voltage, then the second electrical interfaces (aligned with or proximate to thermal interfaces 606a and 606b) are connected to the signal source/sink. If the first electrical interfaces (aligned with thermal interfaces 604a and 604b) are connected to the signal source/sink, then the second electrical interfaces (aligned with thermal interfaces 606a and 606b) are connected to the input signal on line 610. TE 602a and TE602b may be referred to as a TE input stage and resistive elements 612 and 614 may be referred to as a thermopile output stage, see FIGS. 8 and 9.

Figure 7:
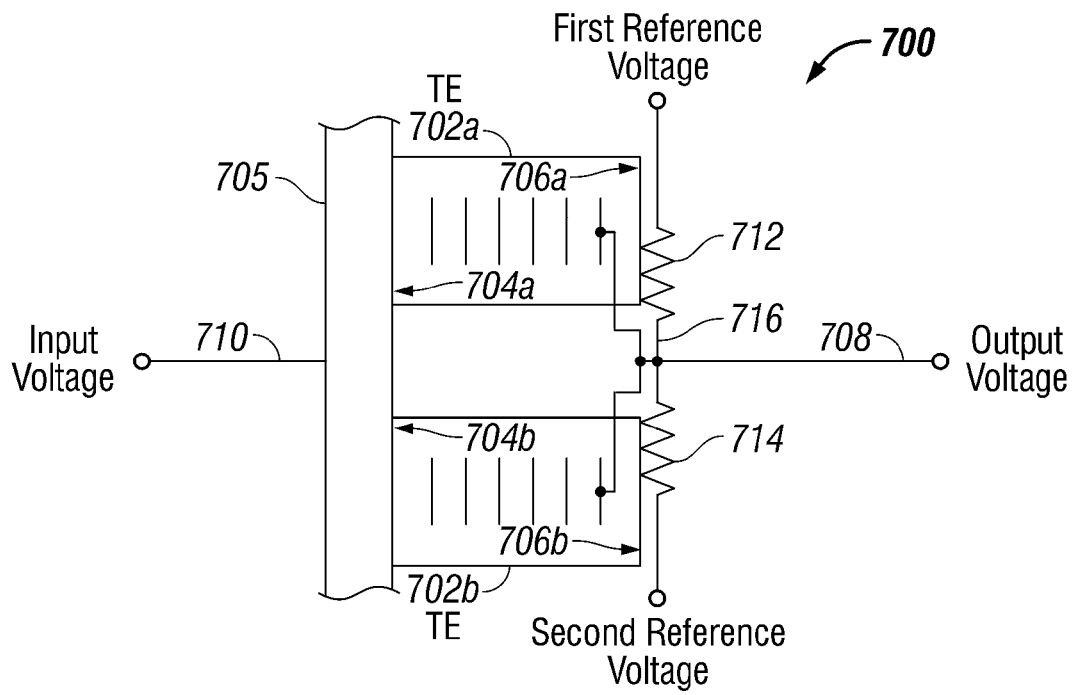
FIG. 7 is a schematic block diagram depicting a TE thermal divider/thermistor divider thermaltronic device with coupled input/output voltages.

FIG. 7 is a schematic block diagram depicting a TE thermal divider/thermistor divider thermaltronic device with coupled input/output voltages. Additional examples of this circuit type can be found in parent application Ser. No. 12/032,549 (see FIGS. 6C and 6D). One electrical interface from each TE element 702a/702b is connected to the input signal on line 710 and the TE element other electrical interfaces are electrically connected to the first resistive element 712 second end 716 (line 708). As shown, the TE element first thermal interfaces 704a and 704b are substantially aligned with (proximate to) the first electrical interfaces, and the TE element second electrical interfaces are substantially aligned with thermal interfaces 706a and 706b. In some aspects, it is assumed for simplicity that thermal and electrical interfaces are a common interface, or that electrical connections are made to the TE through the thermal interfaces. TE 702a and TE 702b may be referred to as a TE input stage, while resistive elements 712 and 714 may be-referred to as a thermopile output stage, see FIGS. 8 and 9. Note: in this device, the combination of the first and second reference voltages act as a signal source/sink for the TE input stage (TE 702a and TE 702b).

Functional Description

As shown above, a simple electronic analog device can be constructed from two thermistors connected in series between the supply voltage and ground, and at least one TE element thermally coupled to the thermistor(s). For example, see FIG. 5. One end of the TE element is electrically connected to a reference voltage, and the other end electrically connected as the input. Current introduced from the input of the TE causes a differential temperature across the TE. The temperature change on the side that is thermally coupled to the thermistor causes a change of resistance through the thermistor. Reversing the direction of current at the input of the TE causes the differential temperature to reverse direction, and the resistance in the coupled thermistor changes direction. The change in thermistor resistance value results in a change in the voltage at the resistor divider output. The temperature differential across the TE device is proportional to the current through it, and the thermistor resistance change is proportional to the change in temperature to which it is subjected. Therefore, the output voltage at the thermistor divider is proportional to the input current to the TE. Thus, the device can perform linear and other analog electronic functions. Combinations of these devices can perform more complex analog functions.

These devices have a low cost of manufacturing. Only metal and dielectric deposition, and patterning is required. No high temperature semiconductor processing is required. That is, no diffusion furnaces or implanters are needed. The starting material can be a sheet of metal. The structures are inherently free of failure due to defects in thin oxides, and insensitive to contamination. The devices can operate over a wide range of supply voltages, and are resistant to EMP, ESD, cosmic rays and Alpha particles.

Figure 10:
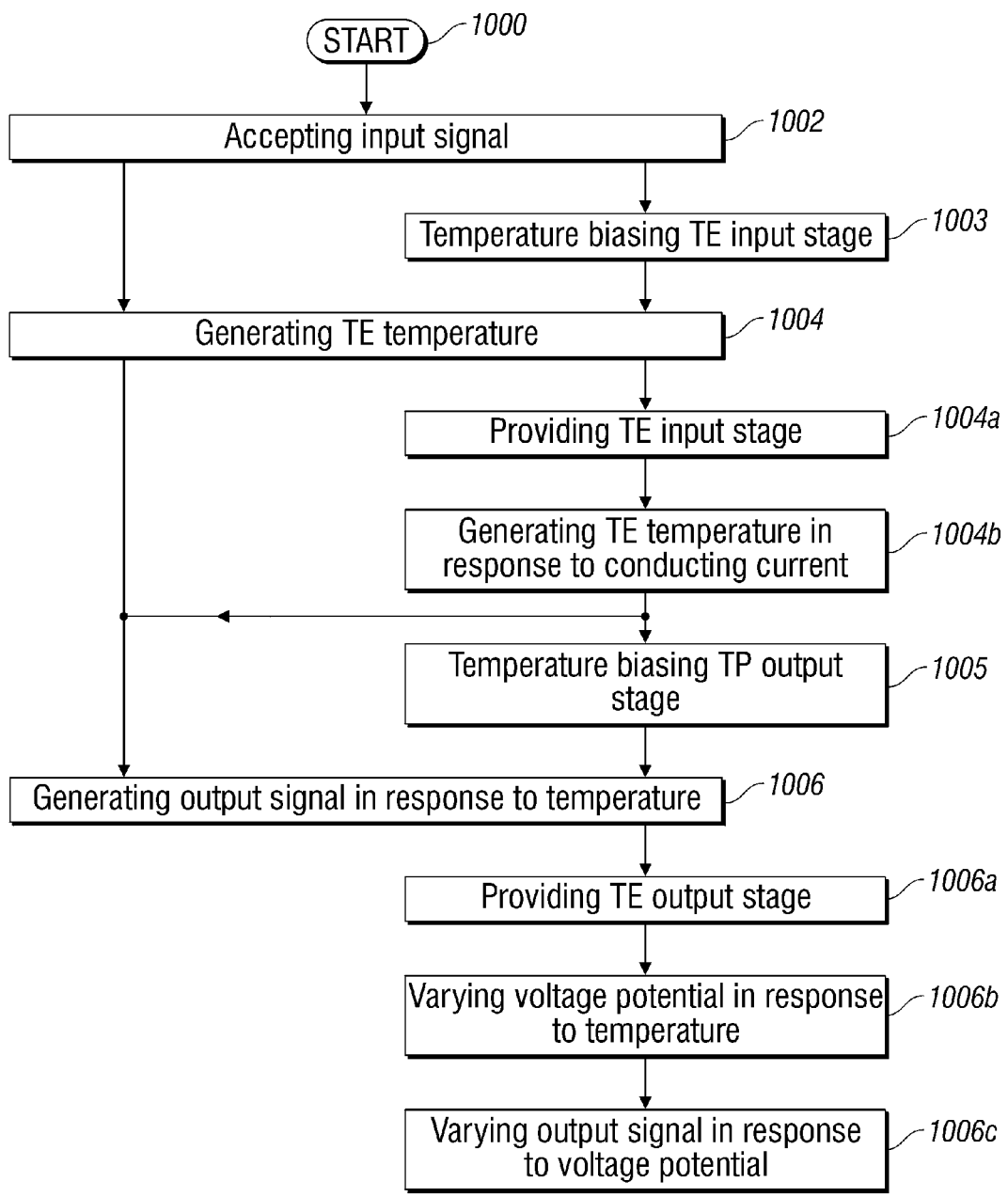
FIG. 10 is a flowchart illustrating a method for the electronic processing of analog signals in thermaltronic device.

FIG. 10 is a flowchart illustrating a method for the electronic processing of analog signals in thermaltronic device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 accepts an analog input signal at a thermaltronic device input. Step 1004 generates a TE temperature having a first transfer function responsive to the input signal that is linear or logarithmic. Step 1006 generates an analog output signal having a second transfer function responsive to the TE that is either linear or logarithmic. The output voltage may have one of the following relationships to the input voltage: inverting, non-inverting, voltage gain, voltage attenuation, current gain, current attenuation, unity voltage gain, or unity current gain. For example, Step 1002 may accept an AC signal and Step 1006 supply an AC output signal. Note: the input and output signals may be referenced as either voltage or current signals.

In one aspect, generating the TE temperature in Step 1004 includes substeps. Step 1004a provides a thermal electric input stage connected between an input signal interface and a signal source/sink interface. In Step 1004b, the thermal electric input stage generates the TE temperature in response to conducting signal between the input signal interface and the signal source/sink interface.

In one aspect, providing the thermal electric input stage in Step 1004a includes providing a thermal electric input stage made from a first material having the first transfer function in a first range of temperatures. In one variation an additional step, Step 1003 temperature biases the thermal electric input stage to have an average temperature within the first range.

In another aspect, generating the output signal in Step 1006 includes substeps. Step 1006a provides a thermopile output stage having a conduction path connected between a signal sink interface and a signal source interface, and an output signal interface. In Step 1006b the thermopile output stage varies the voltage potential in the conduction path in response to the TE temperature. In Step 1006c the thermopile output stage generates the output signal in response to varying the voltage potential in the conduction path.

In one aspect, providing the thermopile output stage in Step 1006a includes providing a thermopile output stage made from a second material having the second transfer function in a second range of temperatures. In one variation an additional step, Step 1005, temperature biases the thermopile output stage to have an average temperature within the second range.

A thermaltronic analog device has been provided. Examples of particular schematics and circuit layouts have been given to help explain the invention. However, the invention is not limited to merely these examples. Other variations and embodiments of the invention will occur to those skilled in the art.

We claim:

1. A method for the electronic processing of analog signals in thermaltronic device, the method comprising;

accepting an analog input signal at a thermal electric (TE) input interface;

in response to conducting the analog input signal through the TE input interface to a source/sink interface, generating a thermal electric (TE) temperature at a TE thermal output interface having a first transfer function responsive to the input signal, selected from a group consisting of linear and logarithmic;

accepting a first reference voltage at a thermopile source interface;

accepting the generated TE temperature at a thermopile thermal input interface;

in response to the generated TE temperature being accepted at the thermopile thermal input interface, varying a voltage in a thermopile conduction path between the thermopile source interface and a thermopile sink interface connected to a second reference voltage; and, generating an analog output signal having a second transfer function responsive to the variation of the voltage in the thermopile. conduction path the second transfer function being selected from the group consisting of linear and logarithmic.

2. The method of claim 1 wherein accepting the analog input signal includes accepting an alternating current (AC) signal; and, wherein generating the analog output signal includes supplying an AC output signal.

3. The method of claim 1 wherein providing the thermal electric input stage includes providing a thermal electric input stage made from a first material having the first transfer function in a first range of temperatures.

4. The method of claim 3 further comprising:
temperature biasing the thermal electric input stage to have an average temperature within the first range.

5. The method of claim 1 wherein providing the thermopile output stage includes providing a thermopile output stage made from a second material having the second transfer function in a second range of temperatures.

6. The method of claim 5 further comprising:
temperature biasing the thermopile output stage to have an average temperature within the second range.

7. The method of claim 1 wherein supplying the output voltage includes supplying an output voltage having a relationship to the input voltage selected from a group consisting of inverting, non-inverting, voltage gain, voltage attenuation, current gain, current attenuation, unity voltage gain, and unity current gain.

8. A thermaltronic analog device comprising:

a thermal electric (TE) input, stage having an input interface to accept an analog input signal, an interface to accept a source/sink signal, and a thermal output interface to supply a TE temperature having a first transfer function with respect to the input signal, the first transfer function being selected from a group consisting of linear and logarithmic; and, a thermopile output stage having a thermal input interface to accept the TE temperature from the TE thermal output interface, a reference signal source interface to accept a first reference voltage, a reference signal sink interface to sink a second reference voltage, the thermopile output stage varying a voltage in a thermopile conduction path between the reference signal source interface and the reference signal sink interface in response to the temperature accepted at the thermopile thermal input interface, and the thermopile output stage having an output to supply an analog output voltage having a second transfer function responsive to the variation of the voltage in the thermopile conduction path, the second transfer function being selected from the group consisting of linear and logarithmic.

9. The device of claim 8 wherein the TE input stage and thermopile output stage are a combination selected from a group consisting of non-inverting and inverting thermaltronic devices.

10. The device of claim 9 wherein the non-inverting and inverting thermaltronic devices are each selected from a group consisting of a single TE/thermistor divider with decoupled input/output voltages, a TE thermal divider/thermistor divider with decoupled input/output, voltages, and a quad-TE.

11. The device of claim 8 wherein the TE input stage has a reference heatsink interface;

wherein the thermopile output stage has a reference heatsink interface;

the device further comprising:

a first reference heatsink interfacing the TE input stage reference heatsink interface; and, a second reference heatsink interfacing the thermopile output stage reference heatsink interface.

12. The device of claim 11 further comprising;

a thermal transfer device interposed between the TE input stage thermal output interface and the thermopile output stage thermal input interface.

13. The device of claim 11 wherein the TE input stage is made from a first material having the first transfer function in a first range of temperatures;

wherein the thermopile output stage is made from a second material having the second transfer function in a second range of temperatures;

the device further comprising:

a first temperature bias generator thermally interfaced to the first reference heatsink to supply a temperature in the first range; and, a second temperature bias generator thermally interfaced to the second reference heatsink to supply a temperature in the second range.

14. The device of claim 8 wherein the TE input stage accepts an alternating current (AC) input signal; and, wherein the thermopile output stage supplies an AC output signal.

15. The device of claim 8 wherein the thermopile output stage supplies an output voltage having a relationship to the input voltage selected from a group consisting of inverting, non-inverting, voltage gain, voltage attenuation, current gain, current attenuation, unity voltage gain, and unity current gain.

16. The device of claim 8 wherein the TE input stage generates the TE temperature in response to conducting a signal along a thermal conduction path between the input interface and the signal source/sink interface.

* * * * *